United States Patent
Kim et al.

(10) Patent No.: US 11,584,227 B2
(45) Date of Patent: Feb. 21, 2023

(54) LIGHT CONTROL FILM AND DISPLAY DEVICE COMPRISING THE SAME

(71) Applicant: SAMSUNG DISPLAY CO., LTD., Yongin-si (KR)

(72) Inventors: Hyang Yul Kim, Hwaseong-si (KR); Jae Hong Kim, Suwon-si (KR); Hyun Ho Jung, Hwaseong-si (KR); Hee Seong Jeong, Suwon-si (KR); Sun Hwa Kim, Hwaseong-si (KR); Hyo Min Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 364 days.

(21) Appl. No.: 16/849,388

(22) Filed: Apr. 15, 2020

(65) Prior Publication Data

US 2021/0031626 A1 Feb. 4, 2021

(30) Foreign Application Priority Data

Aug. 2, 2019 (KR) .................. 10-2019-0094408

(51) Int. Cl.
*B60K 35/00* (2006.01)
*G02B 27/00* (2006.01)
*H01L 51/52* (2006.01)

(52) U.S. Cl.
CPC .......... *B60K 35/00* (2013.01); *G02B 27/0081* (2013.01); *B60K 2370/152* (2019.05); *H01L 51/5281* (2013.01)

(58) Field of Classification Search
CPC .............................. B60K 35/00; G02B 27/0081

USPC ......... 359/613; 345/32; 349/96, 104; 257/89
See application file for complete search history.

(56) References Cited

U.S. PATENT DOCUMENTS

| | | | |
|---|---|---|---|
| 10,203,540 B2 | 2/2019 | Fu et al. | |
| 2007/0075627 A1 | 4/2007 | Kimura et al. | |
| 2009/0102990 A1* | 4/2009 | Walton | H04N 13/312 349/104 |
| 2010/0295755 A1* | 11/2010 | Broughton | G02F 1/1323 345/32 |
| 2013/0299808 A1* | 11/2013 | Sugimoto | H01L 51/56 257/89 |
| 2014/0326958 A1* | 11/2014 | Chung | H01L 51/0021 438/34 |
| 2016/0093684 A1* | 3/2016 | Youk | H01L 27/3223 257/40 |
| 2016/0170246 A1* | 6/2016 | Lu | G02F 1/133512 349/96 |
| 2018/0358579 A1 | 12/2018 | Chen et al. | |
| 2019/0131359 A1 | 5/2019 | Kong et al. | |

(Continued)

FOREIGN PATENT DOCUMENTS

| | | |
|---|---|---|
| JP | 2013-190608 | 9/2013 |
| KR | 10-2007-0090654 | 9/2007 |
| KR | 10-2007-0090662 | 9/2007 |

(Continued)

*Primary Examiner* — Prabodh M Dharia
(74) *Attorney, Agent, or Firm* — F. Chau & Associates, LLC

(57) ABSTRACT

A display device includes a light control film including a first alignment pattern. The display device further includes a display panel including a second alignment pattern. The first alignment pattern and the second alignment pattern are at least partially overlapped with one another.

20 Claims, 19 Drawing Sheets

(56) References Cited

U.S. PATENT DOCUMENTS

2019/0326336 A1* 10/2019 Xi .................... H01L 23/544
2020/0174622 A1* 6/2020 Varjos ................. G06F 3/045

FOREIGN PATENT DOCUMENTS

| KR | 10-2014-0041576 | 4/2014 |
| KR | 10-1474045 | 12/2014 |
| KR | 10-1546564 | 8/2015 |
| KR | 10-1578244 | 12/2015 |
| KR | 10-2016-0083609 | 7/2016 |
| KR | 10-2017-0023165 | 3/2017 |
| KR | 10-1714807 | 3/2017 |
| KR | 10-1728177 | 4/2017 |
| KR | 10-1830969 | 2/2018 |
| KR | 10-1979273 | 5/2019 |
| KR | 10-1983065 | 5/2019 |
| WO | WO2016135811 | 9/2016 |

* cited by examiner

LIGHT CONTROL FILM AND DISPLAY DEVICE COMPRISING THE SAME

CROSS-REFERENCE TO RELATED APPLICATION

This application claims priority to and the benefit of Korean Patent Application No. 10-2019-0094408, filed in the Korean Intellectual Property Office on Aug. 2, 2019, the entire contents of which are herein incorporated by reference.

TECHNICAL FIELD

The present disclosure relates to a display device and, more specifically, to a light control film and a display device including the same.

DISCUSSION OF THE RELATED ART

A display device is a device that is configured to display art image thereupon. Display devices are widely incorporated into various electronic devices such as a cellular phone or smartphone, a portable digital assistant (PDA), a personal computer (PC, a television, and a vehicle information display device, such as an in-vehicle infotainment system and/or navigation guidance system.

In the case of the vehicle information display device, bright sunlight may, at times, cause the display device to be difficult to read. Additionally, the display device may be too bright and this may make it difficult for a driver to see the road at night, especially where light from the display device is reflected off of the windows of the vehicle. These disturbances may cause serious danger to the driver and others.

In order to reduce the problems associated with sunlight entering the vehicle from the windows or light from the display device being reflected to the widows, a blocking film or the like is provided, around the display device. However, as the size of vehicle display devices increase, it may be more difficult to provide a separate blocking film or the like.

SUMMARY

A display device, according to an exemplary embodiment of the present disclosure, includes a light control film including a first alignment pattern. A display panel includes a second alignment pattern. The first alignment pattern and the second alignment pattern at least partially overlap each other.

The light control film may further include a base film at least partially overlapping the display panel. A plurality of viewing angle control patterns at least partially overlap the base film.

The plurality of viewing angle control patterns may include a first pattern with a continuous shape and/or a second pattern with a discontinuous shape.

The plurality of viewing angle control patterns may include both of the first pattern and the second pattern.

The display panel may include a first light emission region corresponding to a first color, a second light emission region corresponding to a second color, and a third light emission region corresponding to a third color.

The second panel has a shape extending primarily along a first direction. The second pattern may be disposed between the adjacent first light emission region and second light emission region.

The first light emission region and the second light emission region may be separated from each other along a second direction.

The first pattern has a shape extending primarily along the first direction. The first pattern may be disposed between adjacent third light emission regions.

The plurality of adjacent third light emission regions may be separated from each other along the second direction.

One second pattern may be disposed between two adjacent first patterns.

The first light emission region and the second light emission region may be alternately disposed along the first direction, and the third light emission region may be disposed between two first light emission regions adjacent along the second direction.

The plurality of viewing angle control patterns may be disposed between at least one of the first light emission region and the second light emission region, and the third light emission region.

The display panel may include a non-light emission region disposed between the adjacent first light emission region, a second light emission region, and third light emission region. The viewing angle control pattern and the alignment pattern may at least partially overlap the non-light emission region.

The light control film may include a plurality of first alignment patterns. At least one of the plurality of first alignment patterns may be spaced apart from the second alignment pattern.

A light control film, according to an exemplary embodiment of the present disclosure, includes a base film. A plurality of viewing angle control patterns at least partially overlap the base film. An alignment pattern at least partially overlaps the base film. The plurality of viewing angle control patterns have a first pattern and a second pattern having different shapes from each other.

Each of the first pattern and the second pattern may have a stripe shape extending primarily along one direction, and a length of the first, pattern in the one direction may be larger than a length of the second pattern in the one direction.

The light control film may include a resin layer disposed between the base film and the plurality of viewing angle control patterns.

The resin layer may be disposed between the upper surface of the base film and the lower surface of the plurality of viewing angle control patterns.

The plurality of viewing angle control patterns and the alignment pattern may include a black pigment, a gray pigment, a black dye, a gray dye, a carbon black, a photoresist, and/or a metal.

The light control film may be used in an automotive display device.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF THE EMBODIMENTS

Figure 1:
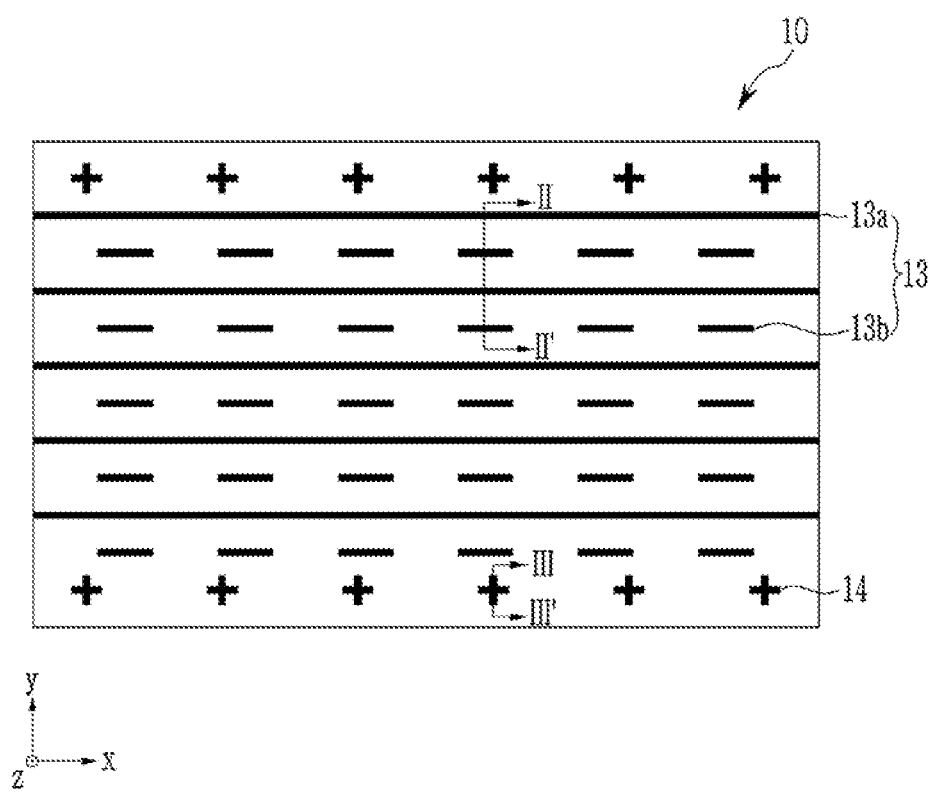
FIG. 1 is a top plan view illustrating a light control film, according to an exemplary embodiment of the present disclosure.

In describing exemplary embodiments of the present disclosure illustrated in the drawings, specific terminology is employed for sake of clarity. However, as those skilled in the art would realize, the described embodiments pray be modified in various different ways, all without departing from the spirit or scope of the present invention.

Like reference numerals may designate like elements throughout the specification and drawings.

Further, the sizes and thicknesses of constituent members, such as layers, films, panels, regions, etc., shown in the accompanying drawings may be exaggerated for providing a better understanding and ease of description. It is noted, however, that the present invention is not necessarily limited to the illustrated sizes and thicknesses. However, the relative sizes, shapes, and angles shown in the figures may be understood to represent at least a particular exemplary embodiment of the present disclosure.

It will be understood that when an element such as a layer, film, region, or substrate is referred to as being "on" another element, it can be directly on the other element or intervening elements may also be present. In Further, in the specification, the word "on" or "above" may mean positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements. However, the use of the phrase "consisting of" will be understood to imply the exclusive inclusion of the stated elements with the exclusion of any other elements.

Figure 2:
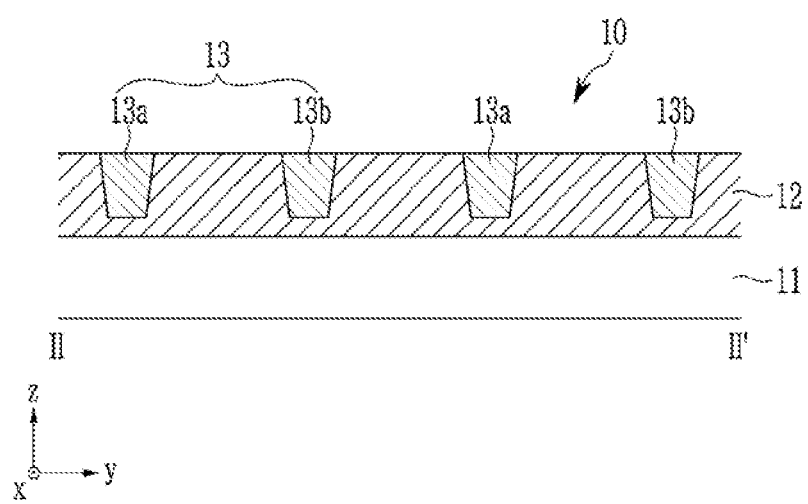
FIG. 2 is a cross-sectional view taken along a line II-II' of FIG. 1.
Figure 3:
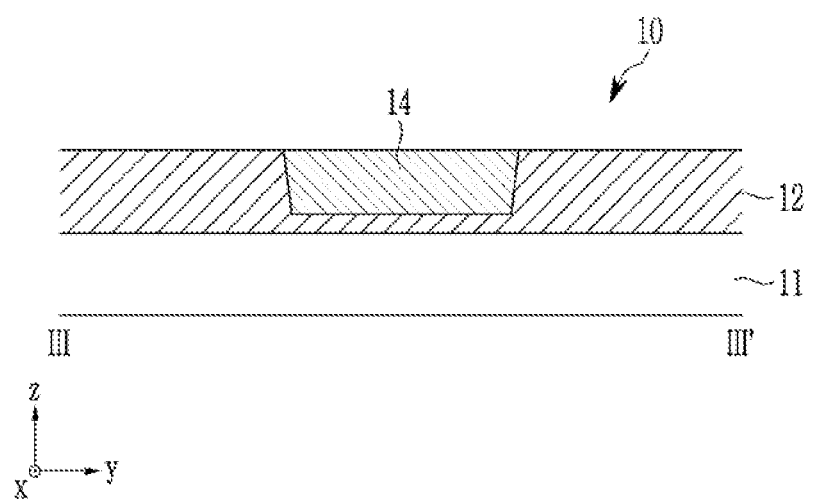
FIG. 3 is a cross-sectional view taken along a line III-III' of FIG. 1.

Now, a light, control film, according to an exemplary embodiment of the present disclosure, is described with reference to FIG. 1 to FIG. 3. FIG. 1 is a top plan view illustrating a light control film according to an exemplary embodiment of the present disclosure. FIG. 2 is a cross-sectional view taken along a line II-II' of FIG. 1. FIG. 3 is a cross-sectional view taken along a line III-III' of FIG. 1.

Referring to FIG. 1 to FIG. 3, a light control film 10, according to an exemplary embodiment of the present disclosure, includes a base film 11 and a plurality of viewing angle control patterns 13 at least partially overlapping the base film 11. The light control film 10 includes a resin layer 12 disposed between the base film 11 and a plurality of viewing angle control patterns 13. The light control film 10, according to an exemplary embodiment of the present disclosure, may be used in automotive display devices, but is not limited thereto.

The base film 11 may include an isotropic material with a relatively high visible light transmittance. For example, the base film 11 may include polyimide (PI), cyclic olefin polymer (COP), polycarbonate (PC), polyethylene terephthalate (PET), polyethylene naphthalate (PEN), polynorbornene (PNB), polyethersulfone (PES), etc. For example, the base film 11 may be a barrier film attached to an upper surface of an encapsulation layer included in an organic light emitting panel.

The resin layer 12 may be disposed on the base film 11. The resin layer 12 may include a resin that may be imprinted or patterned.

The light control film 10, according to an exemplary embodiment of the present disclosure, may include a viewing angle control pattern 13 and a first alignment pattern 14 disposed on the base film 11 and the resin layer 12. The resin layer 12 may be disposed between the viewing angle control pattern 13 and the base film 11, and the resin layer 12 may, at the same time, be disposed between the first alignment pattern 14 and the base film 11. For example, the resin layer 12 may be disposed between the lower surface of the viewing angle control pattern 13 and the upper surface of the base film 11, and the resin layer 12 may, at the same time, be disposed between the lower surface of the first alignment pattern 14 and the upper surface of the base film 11.

The viewing angle control pattern 13 may narrow the viewing angle of the display panel by blocking some of the incident light, for example, the light incident from a display panel, which is described later. The viewing angle control pattern 13 blocks light incident and/or emitted from the display panel with an angle above a certain angle relative to a direction perpendicular to the display panel.

The thickness of the viewing angle control pattern 13 may be changed according to the viewing angle of the display panel. For example, the viewing angle control pattern 13 may have a thickness of several tens of nanometers to several tens of micrometers, but the present invention is not limited thereto. The viewing angle control pattern 13 may have a thickness sufficient to block light traveling from the display panel with an angle of ±30 degrees or more above and below and/or left and right based on a direction perpendicular to the display panel. However, the present invention is not limited to the above-described angle, and may have any thickness that blocks light traveling above a predetermined angle selected according to the exemplary embodiment with respect to the up, down, and/or left and right directions.

The viewing angle control pattern 13, according to an exemplary embodiment of the present disclosure, may include a first pattern 13a extending primarily along the first direction x and having a continuous stripe shape and a second pattern 13b extending primarily along the first direction x and having a discontinuous stripe shape. The first pattern 13a and the second pattern 13b may have different forms.

The viewing angle control pattern 13 may include a plurality of first patterns 13a. Each first pattern of the plurality of first patterns 13a may be spaced apart from each other along a second direction y perpendicular to the first direction x. In addition, the viewing angle control pattern 13 may include a plurality of second patterns 13b. The plurality of second patterns 13b may be arranged continuously along the first direction x and the second direction y, and each second pattern of the plurality of second patterns may be spaced apart from each other. The first pattern 13a and the second pattern 13b may be alternately disposed along the second direction y.

The first pattern 13a may be in the form of a stripe extending primarily from one edge of the light control film 10 toward the other edge facing thereto. The length of the first pattern 13a in the first direction x may be greater than the length of the second pattern 13b in the first direction x.

The light control film 10, according to an exemplary embodiment of the present disclosure, may include the first alignment pattern 14. Although the present specification shows a configuration in which the first alignment pattern 14 has a cross shape on a plane, the present invention is not limited thereto, and the first alignment pattern 14 may have various different shapes such as a circle, a triangle, a quadrangle, and/or a polygon. In addition, the present specification shows only a form in which the plurality of first alignment patterns 14 are arranged along the first direction x, but the present invention is not limited thereto, and the plurality of first alignment patterns 14 may be arranged along the second direction y.

Each of the viewing angle control pattern 13 and the first alignment pattern 14 may include a light blocking material such as a pigment of a dark color such as a black pigment or a gray pigment, a dye of a dark color such as a black dye or a gray dye, a black carbon, or a photoresist, or may include a light reflecting material such as a metal such as aluminum (Al) or silver (Ag).

Each of the viewing angle control pattern 13 and the first alignment pattern 14 may be formed by a printing process or a patterning process. For example, the printing process may use roll printing, imprinting, screen printing, gravure printing, gravure-offset printing, or flexo printing methods known in the art. The patterning process may include a process of forming a mask pattern material on the base film 11 and an etching process of selectively etching the mask pattern material, and the etching process may be a wet etching process or a dry etching process, or a laser scribing process.

Also, as is shown in FIGS. 2 and 3, according to an exemplary embodiment of the present disclosure, the resin layer 12 may be disposed between the viewing angle control pattern 13 and the first alignment pattern 14, and the base film 11. However, the present invention is not limited thereto, and when the height of the direction z of the viewing angle control pattern 13 and the first alignment pattern 14 increases, the viewing angle control pattern 13 and the first alignment pattern 14 may be in contact with the base film 110 while fully penetrating the resin layer 12.

The light control film 10, according to an exemplary embodiment of the present disclosure, includes a plurality of viewing angle control patterns 13 and a plurality of first alignment patterns 14. A light emission region of the display panel to be described later may be disposed between the plurality of viewing angle control patterns 13. The viewing angle control pattern 13 may at least partially overlap the non-light emission region. The light control film 10 may include the viewing angle control pattern 13 at least partially overlapping the non-light emission region so as to transmit the remaining light emitted from the light emission region while blocking the light emitted with the angle greater than a certain angle from the display panel. Accordingly, the viewing angle may be limited as needed while the front direction luminance is increased. In addition, since the light control film 10, according to the exemplary embodiment of the present disclosure, includes the first alignment pattern 14, it may be easy to arrange the viewing angle control pattern 13 to at least partially overlap the non-light emission region.

Figure 4:
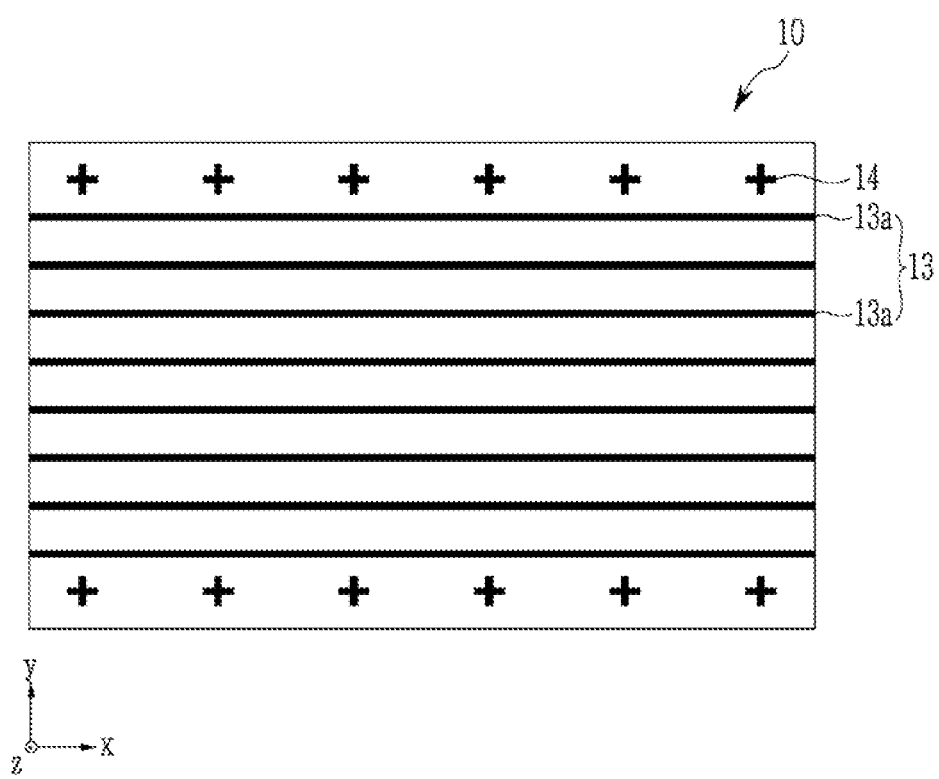
FIG. 4 is a top plan view illustrating a light control film, according to an exemplary embodiment of the present disclosure.
Figure 5:
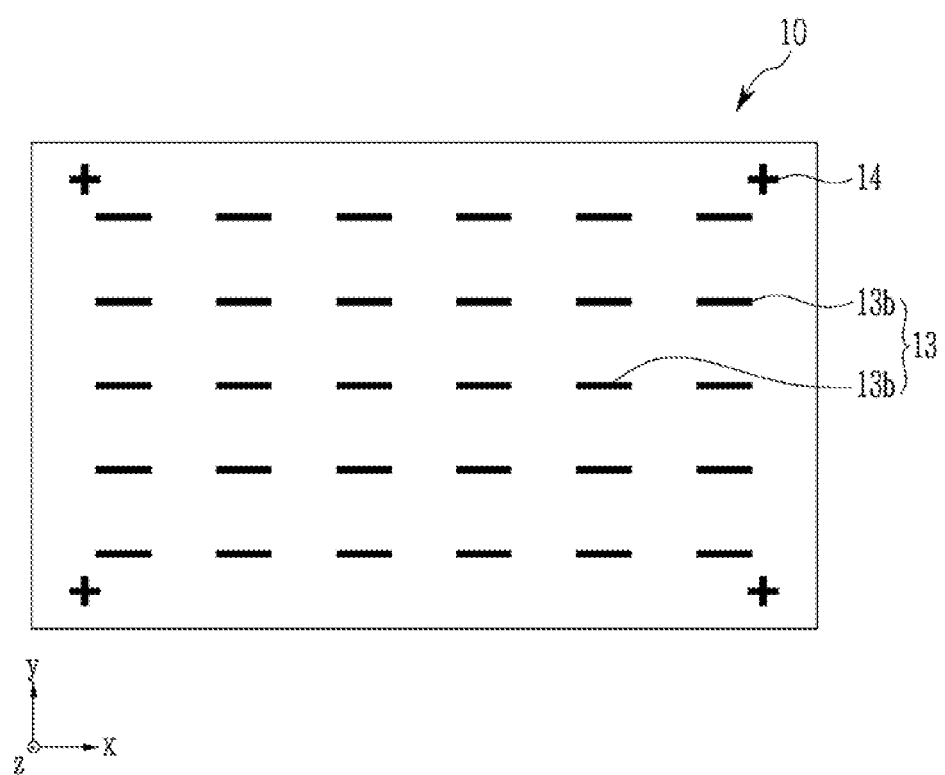
FIG. 5 is a top plan view illustrating a light control film, according to an exemplary embodiment of the present disclosure.

Next, the light control film 10, according to an exemplary embodiment of the present disclosure, is described with reference to FIG. 4 and FIG. 5. FIG. 4 and FIG. 5 are top plan views illustrating a light control film according to an exemplary embodiment of the present disclosure. The description for the same constituent elements as those of the light control film 10 described through FIG. 1 to FIG. 3 is omitted. However, it is to be understood that the omitted details are at least similar to details provided for corresponding elements elsewhere in the present disclosure.

First, referring to FIG. 4, the light control film 10, according to an exemplary embodiment of the present disclosure, may include the viewing angle control pattern 13 of the stripe shape extending primarily along the first direction x, and the first alignment pattern 14.

The light control film 10 may include a plurality of viewing angle control patterns 13. In this case, the viewing angle control pattern 13, according to an exemplary embodiment of the present disclosure, may include only the first pattern 13a of the continuous shape without including the second pattern 13b. The first pattern 13a may have a shape extending primarily from one edge of the light control film 10 to the other edge facing thereto.

Next, referring to FIG. 5, the light control film 10, according to an exemplary embodiment of the present disclosure, may include the viewing angle control pattern 13 and the first alignment pattern 14.

The viewing angle control pattern 13 may include a plurality of second patterns 13b that extend primarily along the first direction x and have a discontinuous shape. The second patterns 13b may be disposed repeatedly along the first direction x and the second direction y, and may be spaced apart from each other.

Figure 6:
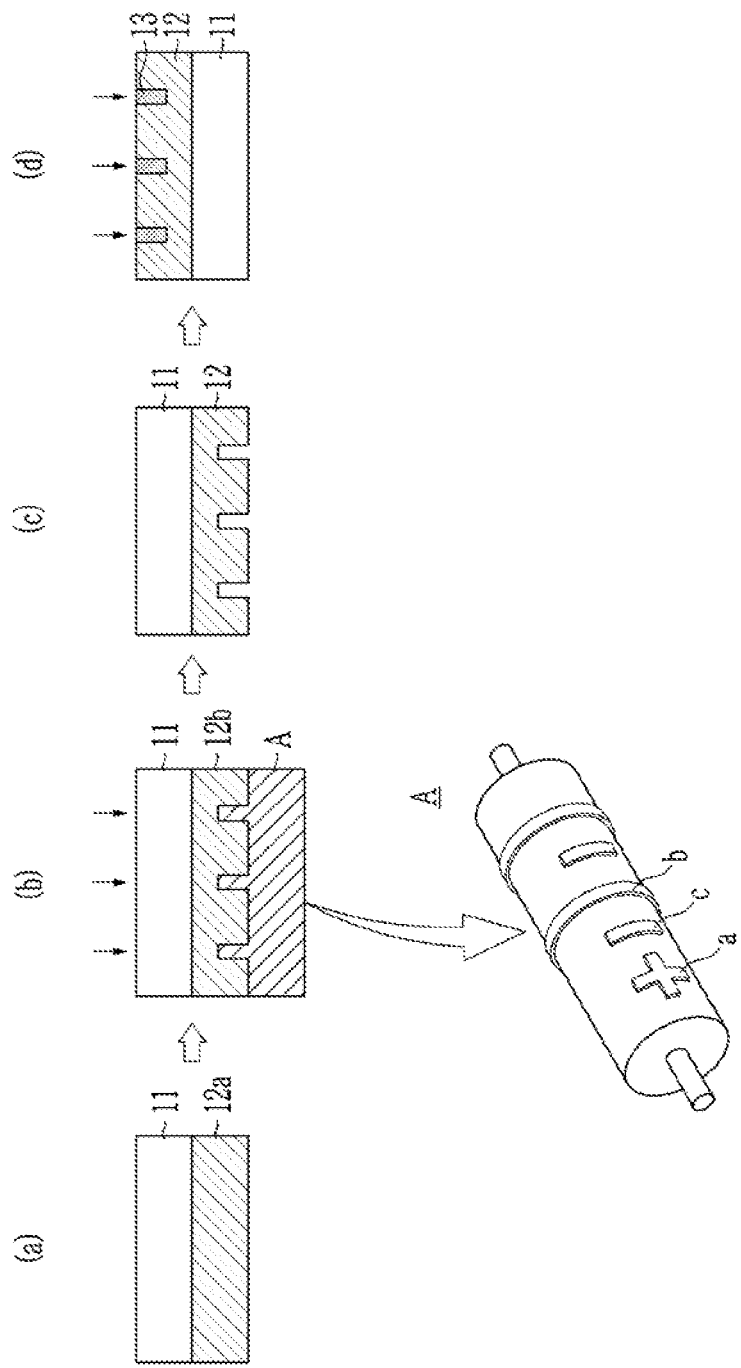
FIG. 6 is a schematic cross-sectional view illustrating a light control film showing an order of performing a manufacturing process, in accordance with exemplary embodiments of the present disclosure.

Next, a method of manufacturing the light control film 10, according to an exemplary embodiment of the present disclosure, is described with reference to FIG. 6. FIG. 6 is a schematic cross-sectional view illustrating a process for manufacturing a light control film.

Referring to element (a), a predetermined resin is coated on a base film 11 to form a first layer 12a.

Next, a mold A, on which a predetermined pattern is formed, is disposed on the base film 11 and the first layer 12a, and an imprinting process is performed thereby. Thus, the first layer 12a has the predetermined pattern of the mold A used in the imprinting process.

In this case, the mold A may include a first protruded part a forming a first alignment pattern, a second protruded part b forming a first pattern and a third protruded part c forming a second pattern. The shape and the type of the protruded part may vary according to need. The second protruded part b may have the continuous shape as described above with the first panel and the third protruded part c may have the discontinuous shape as described above with the second pattern.

Next, as shown in element (b), a UV curing process is performed on the first layer 12b where the pattern is formed. Next, as shown in element (c), the mold is removed to form the resin layer 12 on the base film 11. Finally, as shown in element (d), a black pigment or the like may be injected into a concave space formed by the mold and cured to form a viewing angle control pattern 13 positioned on the resin layer 12. The first alignment pattern may also be formed in the same manner. In this case, at least one of the gray pigment, the black dye, the gray dye, the black carbon, the photoresist, and the metal may be included instead of the black pigment.

The light control film manufactured according to the exemplary embodiment may be cut and used depending on the required size.

Figure 7:
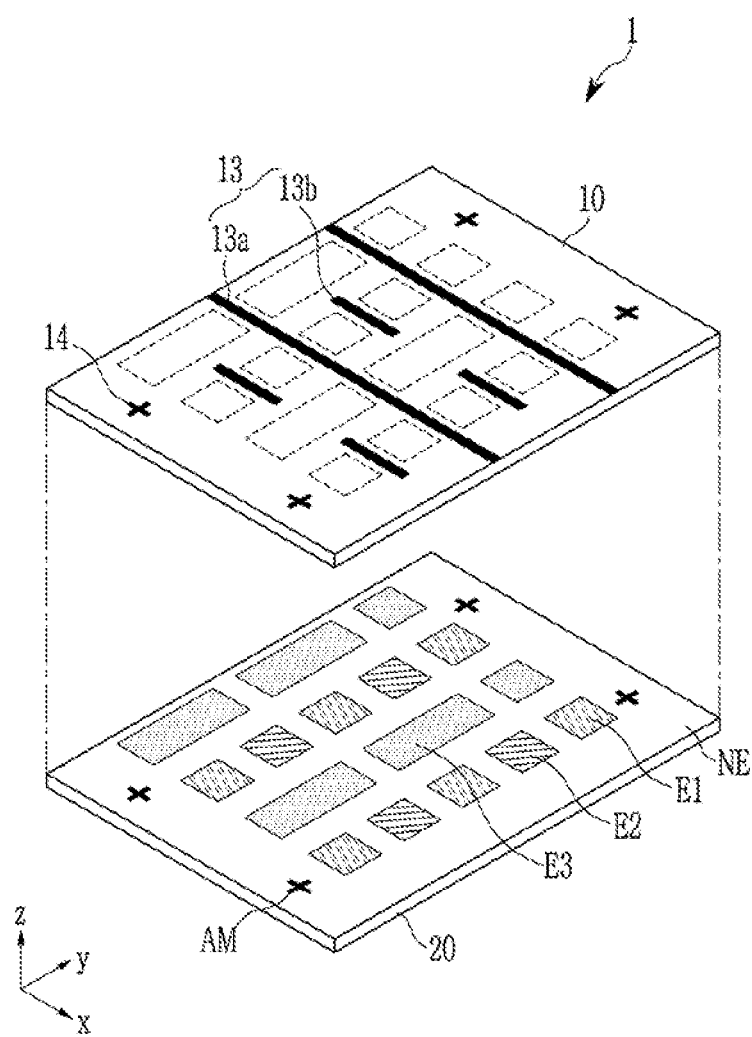
FIG. 7 is a schematic exploded perspective view illustrating a display device according to an exemplary embodiment of the present disclosure.
Figure 8:
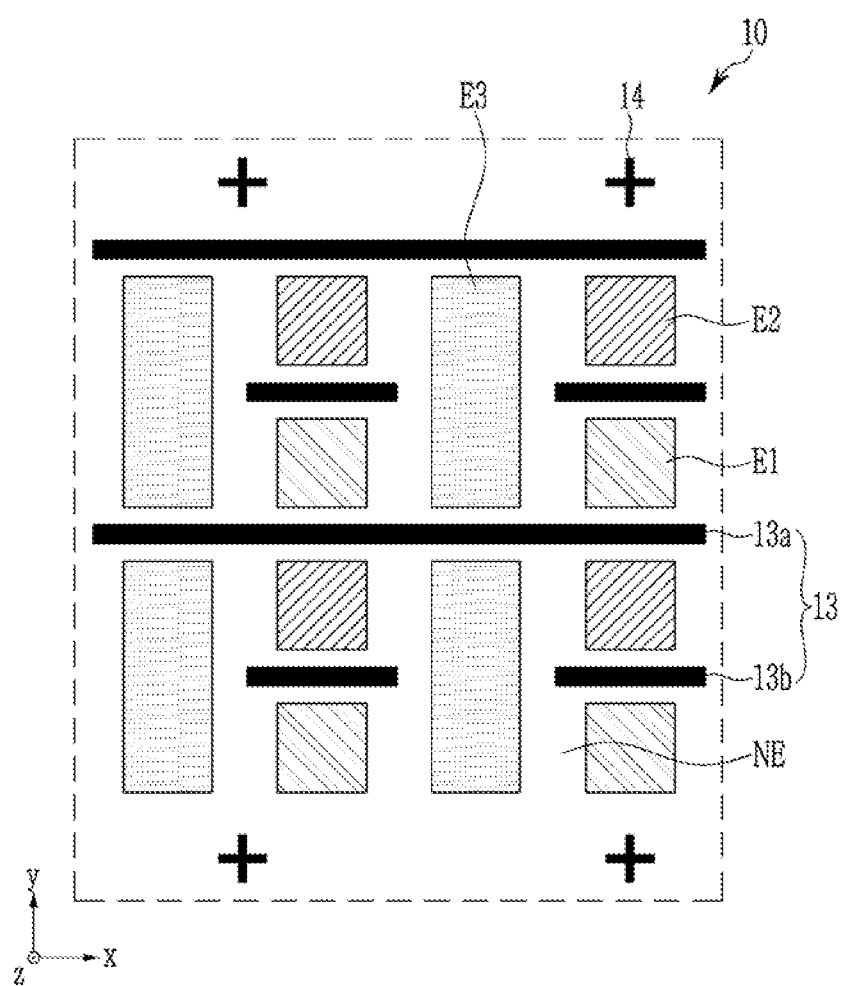
FIG. 8 is a top plan view illustrating a light emission region and a non-light emission region on a light control film, according to an exemplary embodiment of the present disclosure.

Next, the display device, according to an exemplary embodiment of the present disclosure, is described with reference to FIG. 7 and FIG. 8. FIG. 7 is a schematic exploded perspective view illustrating a display device according to an exemplary embodiment of the present disclosure. FIG. 8 is a top plan view illustrating a light emission region and a non-light emission region on a light control film.

First, referring to FIG. 7 and FIG. 8, the display device 1, according to an exemplary embodiment of the present disclosure, includes a light control film 10 and a display panel 20 at least partially overlapping the light control film 10.

The display panel 20 may include light emission regions E1, E2, and E3, and non-light emission region NE. The light emission regions E1, E2, and E2 may include a first light emission region E1 emitting a first color, a second light emission region E2 emitting a second color, and a third light emission region E3 emitting a third color. The first color, the second color, and the third color may be different colors from one another, for example, the first color may be red, the second color may be green, and the third color may be blue, but the first through third colors are not limited thereto. The non-light emission region NE may be disposed between the adjacent light emission regions E1, E2, and E3.

The first light emission region E1, the second light emission region E2, and the third light emission region E3 may have various planar shapes and may be disposed in various forms. The display device, according to an exemplary embodiment of the present disclosure, may have a form in which the first light emission region E1 and the second light emission region E2 are alternately disposed along the second direction y. Also, the third light emission region E3 may be disposed between the first light emission regions E1 adjacent in the first direction x or between the second light emission regions E2 adjacent in the first direction x.

The planar size (e.g. the two-dimensional size in a plan view) of the third light emission region E3 may be larger than the planar size of the first light emission region E1, and may be larger than the planar size of the second light emission region E2. For example, the length of the second direction y of the third light emission region E3 may be larger than the length of the second direction y of the first light emission region E1 and may be larger than the length of the second direction y of the second light emission region E2. The third light emission region E3 may have a long rectangular shape of which a longitudinal length is larger than a transverse length on a plane.

The display panel 20, according to an exemplary embodiment of the present disclosure, may include a second alignment pattern AM disposed in the non-light emission region NE.

The light control film 10, according to an exemplary embodiment of the present disclosure, is disposed to at least partially overlap the display panel 20. For example, the viewing angle control pattern 13 and the first alignment pattern 14 included in the light control film 10 are described.

The light control film 10, according to an exemplary embodiment of the present disclosure, may include the viewing angle control pattern 13, and the viewing angle control pattern 13 may include a first pattern 13a and a second pattern 13b.

The first pattern 13a may have the stripe shape extending primarily along the first direction x. The first pattern 13a may be disposed in the non-light emission region NE between the first light emission region E1 and the second light emission region E2. The first light emission region E1, the first pattern 13a, and the second light emission region E2 may be disposed along the second direction y. The first pattern 13a may also be disposed in the non-light emission region NE between the third light emission regions E3 adjacent along the second direction. The third light emission region E3, the first pattern 13a, and the third light emission region E3 may be disposed along the second direction y.

The second pattern 13b may have the shape extending primarily along the first direction x. The length of the second pattern 13b in the first direction x may be smaller than the length of the first pattern 13a in the first direction. The plurality of second patterns 13b may be disposed repeatedly along the first direction x and the second direction y. The second pattern 13b may be disposed in the non-light emission region NE between the firsts light emission region E1 and the second light emission region E2 on a plane. The first light emission region E1, the second pattern 13b, and the second light emission region E1 may be disposed along the second direction y.

The viewing angle control pattern 13, according to an exemplary embodiment of the present disclosure, at least partially overlaps the non-light emission region NE without overlapping the light emission regions E1, E2, and E3 included in the display panel 20. The viewing angle control pattern 13 might not block the light emitted in the front direction in the light emission regions E1, E2, and E3.

The light control film 10 may include a first alignment pattern 14, and the display panel 20 may include a second alignment pattern AM disposed in the non-light emission region NE. The first alignment pattern 14 and the second alignment pattern AM may at least partially overlap each other in the non-light emission region NE.

In the process of at least partially overlapping the display panel 20 and the light control film 10, the second alignment pattern AM of the display panel 20 and the first alignment pattern 14 of the light control film 10 may be disposed to at least partially overlap each other. Accordingly, since the viewing angle control pattern 13 included in the light control film 10 may be separated from the light emission regions E1, E2, and E3, while at least partially overlapping the non-light emission region NE of the display panel 20, it is possible to suppress the reduction in luminance without blocking the light emitted in the front direction.

Next, the display device, according to an exemplary embodiment of the present disclosure, is described with reference to FIG. 9 to FIG. 12, FIG. 9, FIG. 10, FIG. 11, and FIG. 12 are schematic top plan views of a form in which a light control film is attached to a display panel according to an exemplary embodiment of the present disclosure. For convenience, the light emission regions E1, E2, and E3 and the non-light emission region NE are shown on the light control film 10. The description of the same constituent elements as the above-described constituent elements is omitted. However, it is to be understood that the omitted details are at least similar to details provided for corresponding elements elsewhere in the present disclosure.

Figure 9:
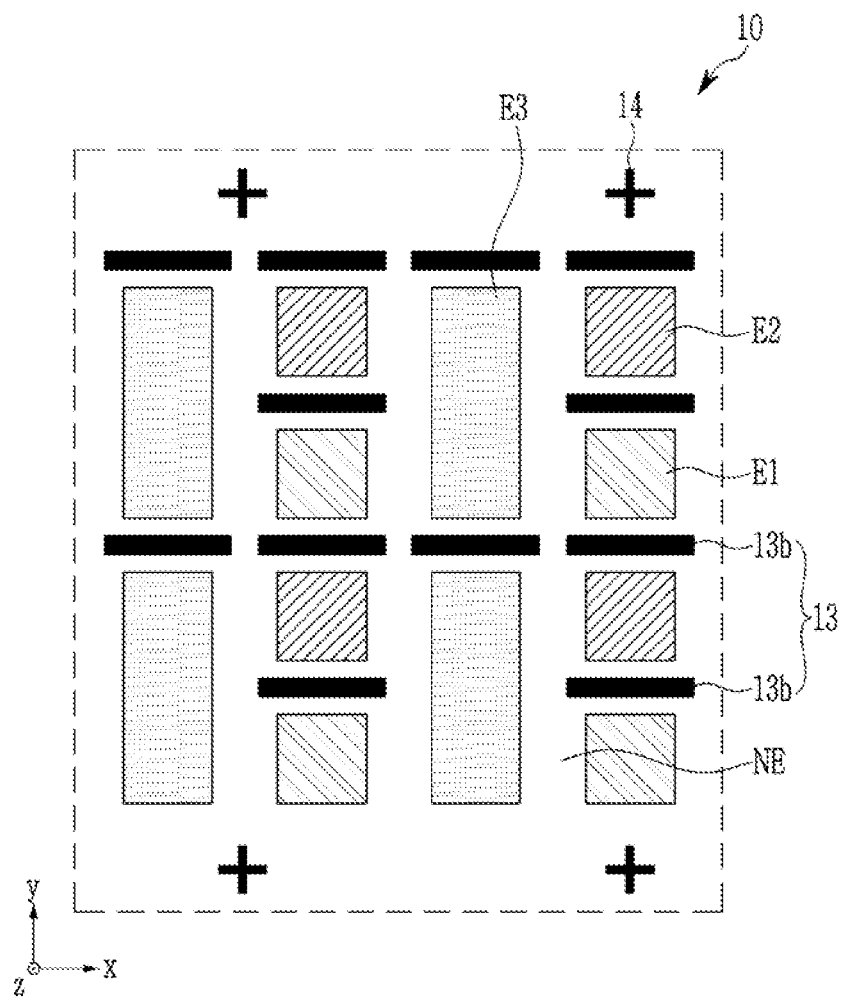
FIG. 9 is a schematic top plan view illustrating a light control film attached to a display panel, according to an exemplary embodiment of the present disclosure.

First, referring to FIG. 9, the light control film 10, according to an exemplary embodiment of the present disclosure, may include only the viewing angle control pattern 13 of the discontinuous shape.

The viewing angle control pattern 13 may include only the second pattern 13b.

The viewing angle control pattern 13, according to an exemplary embodiment of the present disclosure, may include the second pattern 13b disposed between the first light emission region E1 and the second light emission region E2 adjacent along the second direction y and the second pattern 13b disposed between the third light emission regions E3 adjacent along the second direction y. The plurality of second patterns 13b included in the viewing angle control pattern 13, according to an exemplary embodiment of the present disclosure, may be alternately arranged along the first direction x and the second direction y, while at least partially overlapping the non-light emission region NE.

Figure 10:
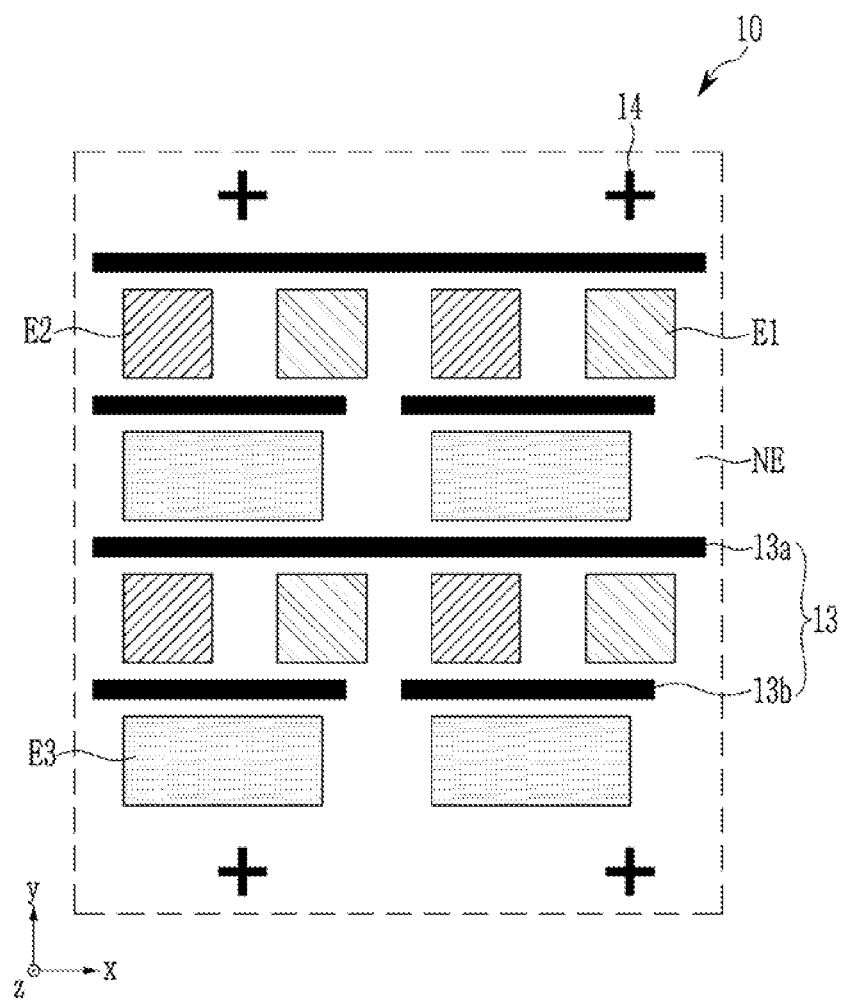
FIG. 10 is a schematic top plan view illustrating a light control film attached to a display panel, according to an exemplary embodiment of the present disclosure.

Next, referring to FIG. 10, the display panel, according to an exemplary embodiment of the present disclosure, may include the light emission regions E1, E2, and E3 and the non-light emission region NE. The light emission regions E1, E2, and E2 may include the first light emission region E1 emitting the first color, the second light emission region E2 emitting the second color, and the third light emission region E3 emitting the third color. The first color, the second color, and the third color may be different colors from each other. The non-light emission region NE may be disposed between the adjacent light emission regions E1, E2, and E3.

The first light emission region E1 the second light emission region E2, and the third light emission region E3 may have the various planar shapes and may be disposed in the various shapes. The display device, according to an exemplary embodiment of the present disclosure, may have the shape in which the first light emission region E1 and the second light emission region E2 are alternately disposed along the first direction x. Also, the third light emission region E3 may be disposed between the first light emission regions E1 adjacent in the second direction or between the second light emission regions E2 adjacent in the second direction y.

The planar size of the third light emission region E3 may be larger than the planar size of the first light emission region E1, and may also be larger than the planar size of the second light emission region E2. For example, the length of the third light emission region E3 in the first direction x may be greater than the length of the first light emission region E1 in the first direction x or greater than the length of the second light emission region E2 in the first direction. The third light emission region E3 may have the rectangular shape in which the transverse length is larger than the longitudinal length on the plane.

The light control film 10, according to an exemplary embodiment of the present disclosure, is disposed to at least partially overlap the display panel 20. For example, the viewing angle control pattern 13 and the first alignment pattern 14 included in the light control film 10 are described.

The light control film 10, according to an exemplary embodiment of the present disclosure, may include the viewing angle control pattern 13, and the viewing angle control pattern 13 may include the first pattern 13a and the second pattern 13b.

The first pattern 13a may have the stripe shape extending primarily along the first direction x. The first pattern 13a may be disposed to at least partially overlap the non-light emission region NE between the first light emission region E1 and the third light emission region E3 or the non-light emission region NE between the second light emission region E2 and the third light emission region E3. The first light emission region E1, the first pattern 13a, and the third light emission region E3 may be disposed along the second direction y. Also, the second light emission region E2, the first pattern 13a, and the third light emission region E3 may be disposed along the second direction y.

The second pattern 13b may have the shape extending primarily along the first direction x. The length of the second pattern 13b in the first direction x may be smaller than the length of the first pattern 13a in the first direction. The plurality of second patterns 13b may be disposed repeatedly along the first direction x and the second direction y. The second pattern 13b may be disposed between the first light emission region E1 and the third light emission region E3 or between the second light emission region E2 and the third light emission region E3 on a plane.

According to an exemplary embodiment of the present disclosure, the degree to which the light emitted in the up and down direction in the first light emission region E1 is blocked by the viewing angle control pattern 13 may be substantially equal to the degree to which the light emitted in the up and down direction in the second light emission region E2 is blocked by the viewing angle control pattern 13. In addition, the degree to which the light emitted in the up and down direction in the first light emission region E1 is blocked by the viewing angle control pattern 13 may be substantially the same as the degree to which the light emitted in the up and down direction in the third light emission region E3 is blocked by the viewing angle control pattern 13. The light emitted in the vertical direction in each of the first light emission region E1, the second light emission region E2, and the third light emission region E3 may be blocked to have substantially the same viewing angle by the viewing angle control pattern 13, thereby providing the uniform luminance and increasing the display quality of the display device.

The viewing angle control pattern 13, according to an exemplary embodiment of the present disclosure, at least partially overlaps the non-light emission region NE without overlapping the light emission regions E1, E2, and E3 included in the display panel 20. The viewing angle control pattern 13 might not block light emitted in the front direction in the light emission regions E1, E2, and E3.

Figure 11:
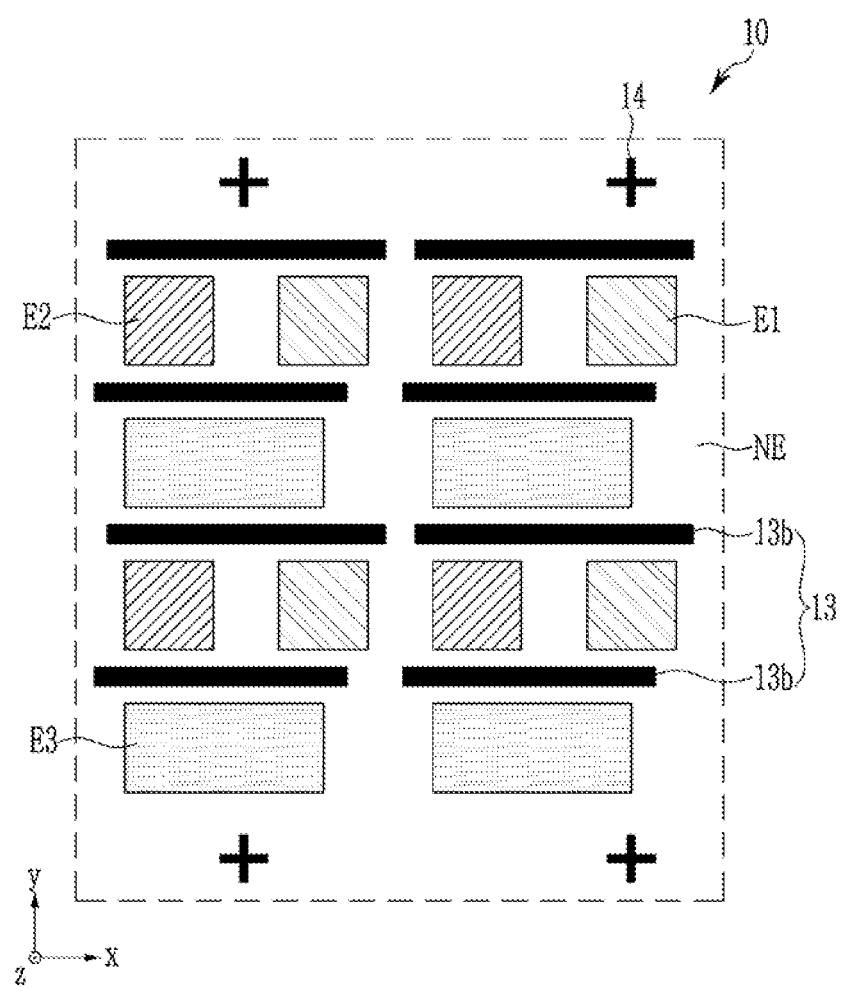
FIG. 11 is a schematic top plan view illustrating a light control film attached to a display panel, according to an exemplary embodiment of the present disclosure.

Next, referring to FIG. 11, the viewing angle control pattern 13 may only include the second pattern 13b without including the first pattern 13a. The viewing angle control pattern 13, according to an exemplary embodiment of the present disclosure, may include the second pattern 13b disposed between the first light emission region E1 and the third light emission region E3 and the second pattern 13b disposed between the second light emission region E2 and the third light emission region E3. The light control film 10, according to an exemplary embodiment of the present disclosure, may only include a plurality of second patterns 13b without including any of the first patterns 13a. A plurality of second patterns 13b may be disposed repeatedly along the first direction x and the second direction y.

Figure 12:
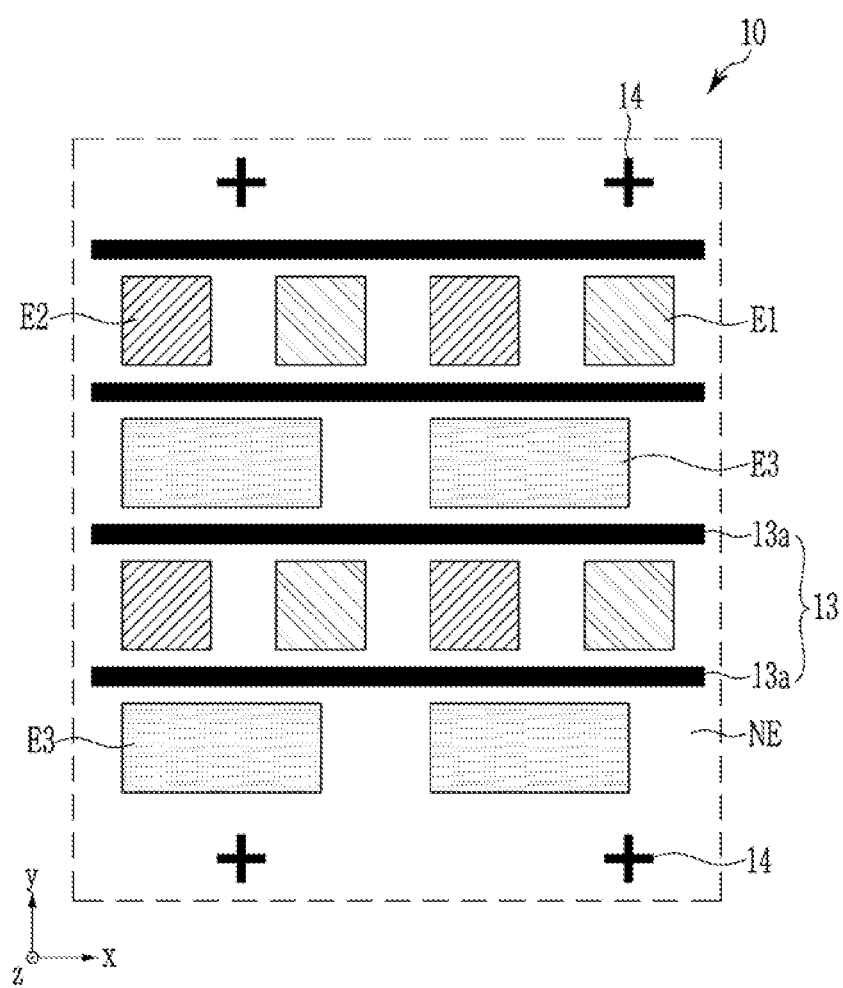
FIG. 12 is a schematic top plan view illustrating a light control film attached to a display panel, according to an exemplary embodiment of the present disclosure.

Next, referring to FIG. 12, the viewing angle control pattern 13 may only include the first pattern 13a without including the second pattern 13b. The viewing angle control pattern 13, according to an exemplary embodiment of the present disclosure, may include the first pattern 13a disposed between the first light emission region E1 and the third light emission region E3 and the first pattern 13a disposed between the second light emission region E2 and the third light emission region E3. The light control film 10, according to an exemplary embodiment of the present disclosure, may include only a plurality of first patterns 13a without including any of the second patterns 13b. A plurality of first patterns 13a may be disposed repeatedly along the second direction y.

Figure 13:
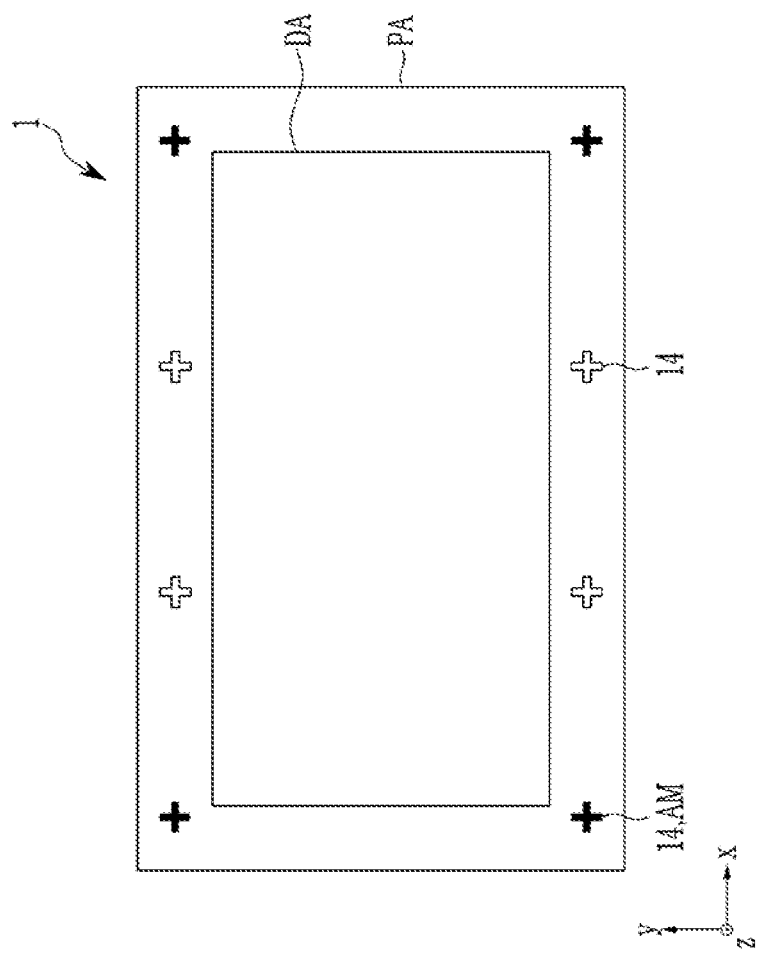
FIG. 13 is a schematic top plan view illustrating a display device, according to an exemplary embodiment of the present disclosure.

Next, the display device, according to an exemplary embodiment of the present disclosure, is described with reference to FIG. 13. FIG. 13 is a schematic top plan view of a display device according to an exemplary embodiment of the present disclosure.

Next, referring to FIG. 13, the display device 1 may include the first alignment pattern 14 and the second alignment pattern AM at least partially overlapping the non-display area PA enclosing the display area DA.

The number of the second alignment patterns AM included in the display panel may be different from the number of first alignment patterns 14 included in the light control film 10. The number of the first alignment patterns 14 included in the light control film 10 may be greater than the number of the second alignment patterns AM included in the display panel. Some of the plurality of first alignment patterns 14 included in the light control film 10 may at least partially overlap the second alignment pattern AM, and the remaining first alignment pattern 14 may at least partially overlap the non-display area PA. As shown in FIG. 13, the second alignment pattern AM and the first alignment pattern 14 disposed adjacent to four vertices with respect to the plane of the display device 1 may at least partially overlap each other. The remaining first alignment pattern 14 disposed between the first alignment patterns 14 might not overlap the second alignment pattern AM.

Figure 14:
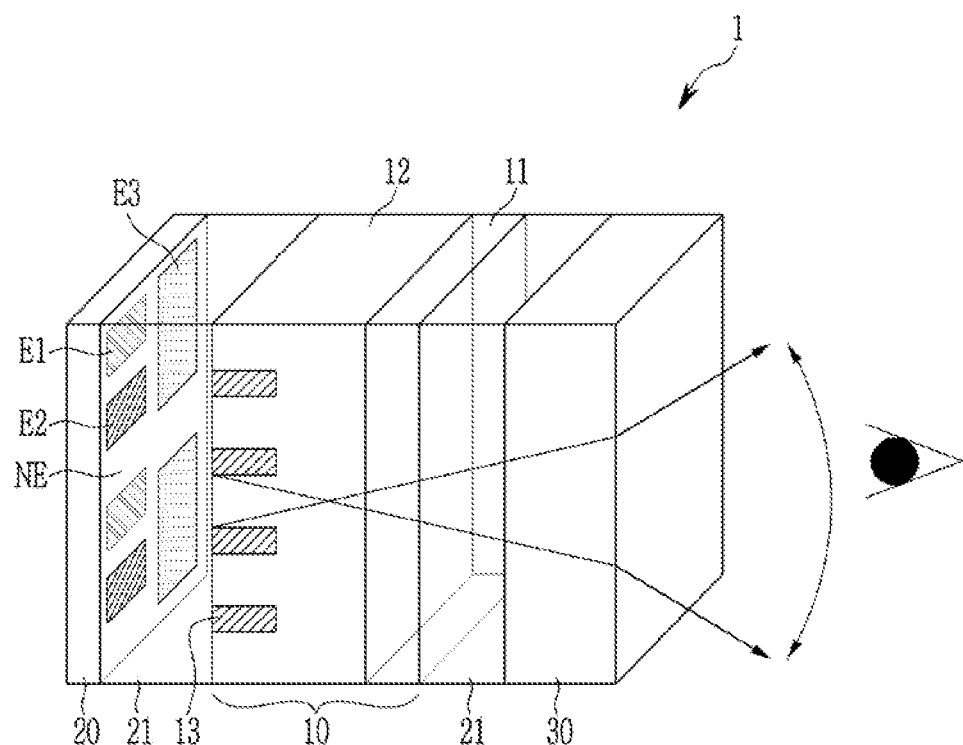
FIG. 14 is a schematic exploded perspective view illustrating a display device, according to an exemplary embodiment of the present disclosure.
Figure 15:
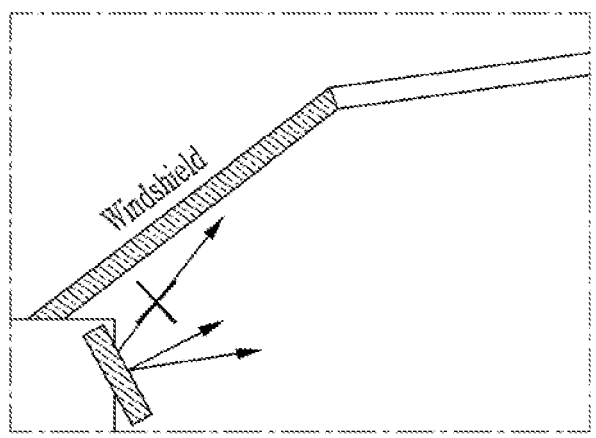
FIG. 15 is a cross-sectional view illustrating a path of light emitted from a display device, according to an exemplary embodiment of the present disclosure.
Figure 16:
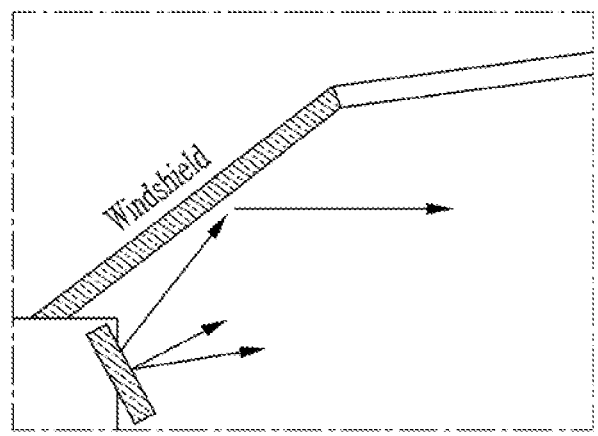
FIG. 16 is a cross-sectional view illustrating a path of light emitted from a display device, according to a comparative example.

Next, the light emitted from the display device, according to an exemplary embodiment of the present disclosure, and a comparative example is described with reference to FIG. 14 to FIG. 16. FIG. 14 is a schematic exploded perspective view illustrating a display device according to an exemplary embodiment of the present disclosure. FIG. 15 is a cross-sectional view illustrating a path of light emitted from a display device according to an exemplary embodiment of the present disclosure. FIG. 16 is a cross-sectional view illustrating a path of light emitted from a display device according to a comparative example.

Referring to FIG. 14, the display device, according to an exemplary embodiment of the present disclosure, may include a display panel 20 including the plurality of light emission regions E1, E2, and E3 and the non-light emission region NE, an adhesive layer 21 disposed on the display panel 20, a light control film 10 disposed on the adhesive layer 21, and an adhesive layer 21 and a window 30 disposed on the light control film 10. Here, the adhesive layer 21 may be transparent, and may be an optically clear adhesive (OCA), an optically curable resin (OCR), or an ultraviolet resin.

Light emitted from the light emission regions E1, E2, and E3 may be visible to the user by passing through the light control film 10 and the window 30. At this time, the light emitted with the predetermined angle or light emitted with a more upward or downward angle than the predetermined angle, with respect to the direction perpendicular to the window 30, may be blocked by the viewing angle control pattern 13 included in the light control film 10.

Accordingly, as shown in FIG. 15, light emitted toward a vehicle window (e.g., a windshield) may be blocked in the display device. Therefore, the light emitted from the display device may be prevented from being reflected by the windshield of the automobile. By blocking the light to the windshield of the automobile, the reflection image may be prevented from occurring and the driver's safety may be secured.

However, if such a light control film is not included, as shown in FIG. 16, as the light emitted from the display device is emitted at various angles, some of the light may be emitted toward the windshield of the vehicle and may be perceived as a reflection image by the user, which may be potentially distracting to the driver.

Figure 17:
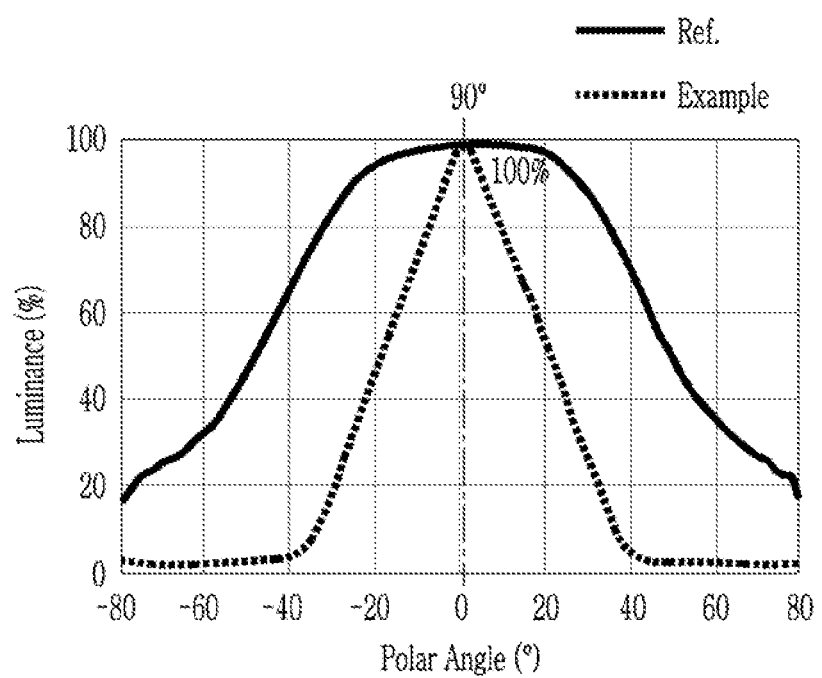
FIG. 17 is a graph illustrating luminance of a display device, according to an exemplary embodiment of the present disclosure.
Figure 18:
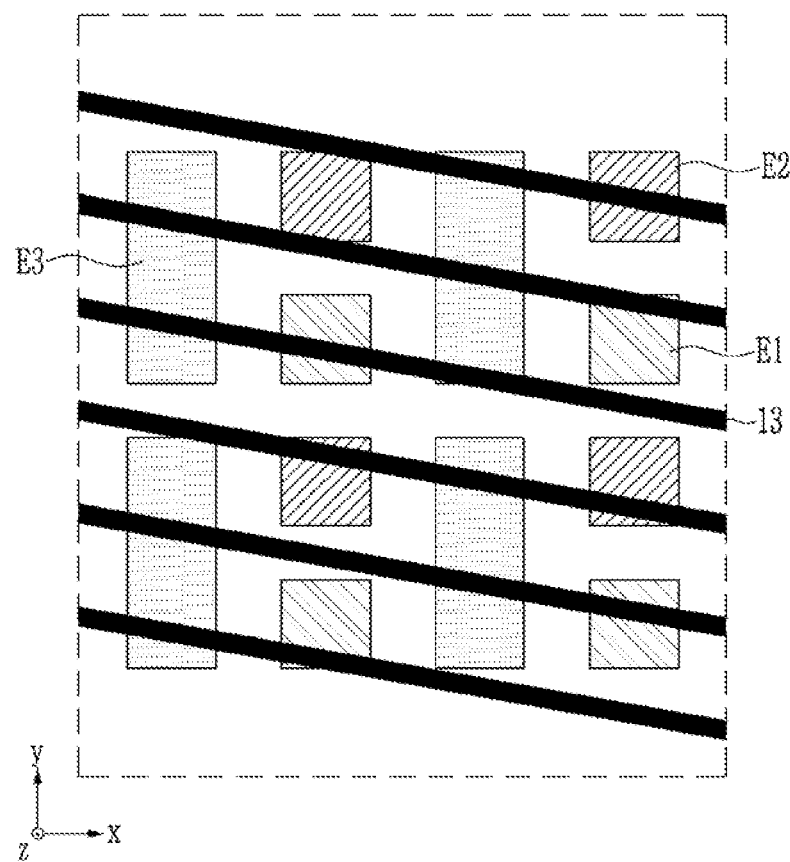
FIG. 18 is a schematic top plan view illustrating a display device, according to a comparative example.
Figure 19:
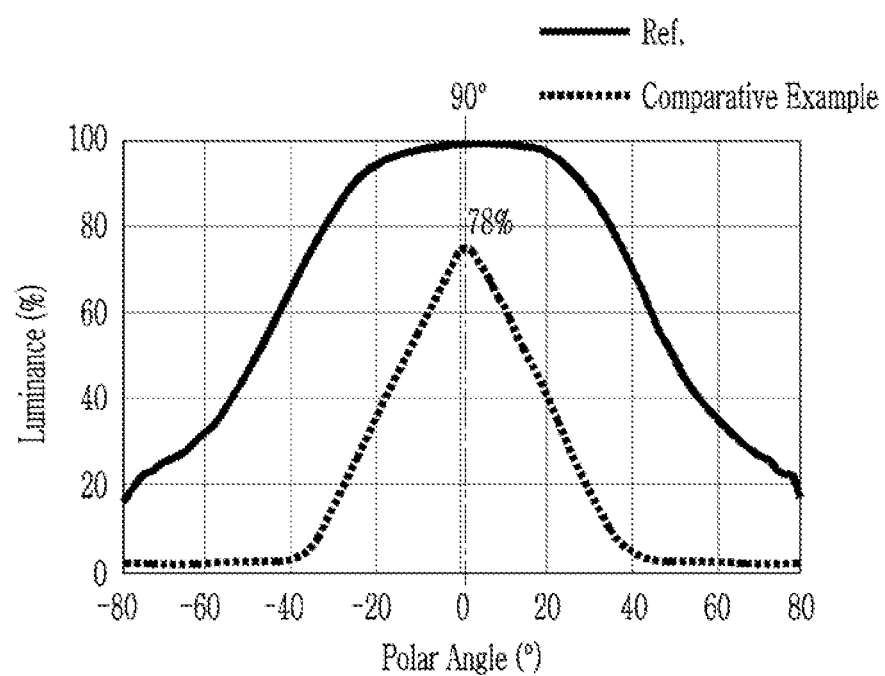
FIG. 19 is a graph illustrating luminance of a display device, according to a comparative example of FIG. 18.

Next, the front luminance, according to the exemplary embodiment of the present disclosure, and the comparative example is described with reference to FIG. 17 to FIG. 19. FIG. 17 is a graph illustrating a luminance of a display device according to an exemplary embodiment of the present disclosure. FIG. 18 is a schematic top plan view illustrating a display device according to a comparative example. FIG. 19 is a graph illustrating a luminance of a display device according to the comparative example of FIG. 18.

Referring to FIG. 17, the light control film including the alignment pattern may provide the viewing angle control pattern that does not overlap the light emission region of the display panel. Since the light control film does not block light emitted in the vertical direction (e.g., the front direction) for the plane of the display device, it may be noted that the front direction luminance has the same level of luminance as the display device (Ref) that does not include the light control film.

In addition, in the case of the display device, according to an exemplary embodiment of the present disclosure, since the viewing angle control pattern of the light control film does not overlap the light emission region, a moiré phenomenon does not occur, thereby providing the increased display quality.

But as shown in FIG. 18, in the case of the comparative example including the light control film that does not include the alignment pattern, the viewing angle control pattern 13 overlaps the light emission regions E1, E2, and E3. The light control film may be attached to the display panel in a random shape, and thus some light emitted from the light emission region may be blocked.

Since the light emitted in the front direction of the display device, according to the comparative example, is blocked by the viewing angle control pattern of the light control film, it may be confirmed that it has only about 78% luminance compared to the display device (Ref) that does not include the light control film. The light emission region is obscured by the light control film attached in a random shape, thereby causing a problem that the front luminance emitted from the display panel is reduced.

Also, it is confirmed that the exemplary embodiment has about 51% luminance and the comparative example has about 35% luminance based on a predetermined zone in which the left and right direction viewing angles are 30 degrees the upper direction viewing angle is 20 degrees, and the lower direction viewing angle is 10 degrees in the display device. In the case of the exemplary embodiment, it is confirmed that the increased luminance is provided for the same criteria.

In addition, for the display device, according to the comparative example, the viewing angle control pattern may be attached to be inclined in the first or second direction to prevent the moiré between the light control film and the display panel. Accordingly, the areas of the viewing angle control pattern crossing each of the first light emission region, the second light emission region, and the third light emission region may be different from each other. Also, the area of the viewing angle control pattern crossing each of the plurality of first light emission regions, the plurality of second light emission regions, or the plurality of third light emission regions may also vary therebetween. Thus, this may cause a problem in that light of different luminance is emitted from each light emission region.

However, the light control film, according to an exemplary embodiment of the present disclosure, includes a plurality of viewing angle control patterns and a plurality of first alignment patterns. A plurality of viewing angle control patterns may at least partially overlap the non-light emission region and may be spaced apart from the light emission region by the first alignment pattern. As the light control film, according to an exemplary embodiment of the present disclosure, includes the viewing angle control pattern at least partially overlapping the non-light emission region, the remaining light emitted from the light emission region is transmitted while blocking the light emitted with the angle greater than a certain angle from the display panel, thereby providing the viewing angle required for the display device and the increased front direction luminance.

Exemplary embodiments provide a light control film for controlling a wide viewing angle into a narrow viewing angle. Also, exemplary embodiments provide a display device including a light control film with improved front luminance. According to exemplary embodiments, it is possible to control the reflection of the predetermined image on the substrate (or the windshield) through the light control film. In addition, it is possible to provide the display device having improved display quality by increasing the amount of light emitted in the front direction.

While exemplary embodiments of the present disclosure have been described in connection with the drawings, it is to be understood that the invention is not limited exclusively to the disclosed embodiments. On the contrary, the present invention it is intended to cover various modifications and equivalent arrangements included within the spirit and scope of the present disclosure.

What is claimed is:

1. A display device, comprising:
a light control film including a first alignment pattern; and
a display panel including a second alignment pattern,
wherein the first alignment pattern and the second alignment pattern are at least partially overlapped, and
wherein the light control film includes a set of patterns that are aligned with a non-light emission region of the display panel that separates light emission elements of the display panel from each other.

2. The display device of claim 1, wherein the light control film further includes a base film at least partially overlapping the display panel and the set of patterns of the light control film includes a plurality of viewing angle control patterns at least partially overlapping the base film.

3. The display device of claim 2, wherein the plurality of viewing angle control patterns includes a first pattern with a continuous shape and/or a second pattern with a discontinuous shape.

4. The display device of claim 3, wherein the plurality of viewing angle control patterns include the first pattern and the second pattern.

5. The display device of claim 4, wherein the second pattern of a first viewing angle control pattern of the plurality of viewing angle control patterns, is disposed between a first pattern of the first viewing angle control pattern of the plurality of viewing angle control patterns, and a first pattern of a second viewing angle control pattern of the plurality of viewing angle control patterns.

6. The display device of claim 3, wherein the light emission elements of the display panel includes:
a first light emission region corresponding to a first color;
a second light emission region corresponding to a second color; and
a third light emission region corresponding a third color.

7. The display device of claim 6, wherein the second pattern extends primarily along a first direction and is disposed between the first light emission region and second light emission region.

8. The display device of claim 7, wherein the first light emission region and the second light emission region are separated along a second direction different from the first direction.

9. The display device of claim 6, wherein the display panel further includes an additional first light emission region, an additional second light emission region, and an additional third light emission region and the first pattern extends primarily along a first direction and is disposed between the third light emission region and the additional third light emission region.

10. The display device of claim 9, wherein the third light emission region and the additional third light emission region are separated from each other along a second direction.

11. The display device of claim 6, wherein the display panel further includes an additional first light emission region, an additional second light emission region, and an additional third light emission region, the first light emission region and the second light emission region are alternately disposed along a first direction, and the third light on region is disposed between the first light emission region and the additional first light emission region, which is adjacent to the first light emission region along a second direction.

12. The display device of claim 11, wherein the plurality of viewing angle control patterns is disposed between the first light emission region and the second light emission region, between the second light emission region and the third light emission region, and/or between the first light emission region and the third light emission region.

13. The display, device of claim 6, wherein the non-light emission region is disposed between the first light emission region and the second light emission region, between the second light emission region and the third light emission region, and/or between the first light emission region and the third light emission region, and the viewing angle control pattern and the alignment pattern at least partially overlap the non-light emission region.

14. The display device of claim 1, wherein the set of patterns of the light control film includes a plurality of first alignment patterns, and at least one of the plurality of first alignment patterns is spaced apart from the second alignment pattern.

15. A light control film, comprising:
a base film;
a plurality of viewing angle control patterns at least partially overlapping the base film; and
an alignment pattern at least partially overlapping the base film,
wherein the plurality of viewing angle control patterns includes a first pattern and a second pattern having different shapes from each other, and
wherein the first pattern and the second pattern are aligned with a non-light emission region of a display panel that separates light emission elements of the display panel from each other.

16. The light control film of claim 15, wherein: each of the first pattern and the second pattern has a stripe shape extending primarily along a first direction, and a length of the first pattern along the first direction is larger than a length of the second pattern along the first direction.

17. The light control film of claim 15, wherein the light control film includes a resin layer disposed between the base film and the plurality of viewing angle control patterns.

18. The light control film of claim 17, wherein the resin layer is disposed between an upper surface of the base film and a lower surface of the plurality of viewing angle control patterns.

19. The light control film of claim 15, wherein the plurality of viewing angle control patterns and the alignment pattern each include a black pigment, a gray pigment, a black dye, a gray dye, a black carbon, a photoresist, antics a metal.

20. The light control film of claim 15, wherein the light control film is included within an automotive display device.

* * * * *